United States Patent [19]

Kurokawa

[11] Patent Number: 4,739,453
[45] Date of Patent: Apr. 19, 1988

[54] SHIELDING APPARATUS FOR A PRINTED CIRCUIT BOARD

[75] Inventor: Osamu Kurokawa, Tokyo, Japan

[73] Assignee: Kabushiki Kaisha Toshiba, Kanagawa, Japan

[21] Appl. No.: 27,879

[22] Filed: Mar. 19, 1987

[30] Foreign Application Priority Data

Mar. 20, 1986 [JP] Japan .............................. 61-41632[U]

[51] Int. Cl.$^4$ .............................................. H05K 9/00
[52] U.S. Cl. .................... 361/424; 174/68.5; 361/414
[58] Field of Search ............ 174/51, 35 R, 68.5; 361/395, 399, 400, 409, 410, 414, 422, 424

[56] References Cited

U.S. PATENT DOCUMENTS

| | | | |
|---|---|---|---|
| 3,533,023 | 10/1970 | Friend | 361/414 |
| 3,680,005 | 7/1972 | Jorgensen | 361/414 |
| 4,494,095 | 1/1985 | Noji | 361/424 |
| 4,498,122 | 2/1985 | Rainal | 174/68.5 |
| 4,649,461 | 3/1987 | Matsuta | 174/51 |

*Primary Examiner*—G. P. Tolin
*Attorney, Agent, or Firm*—Banner, Birch, McKie & Beckett

[57] ABSTRACT

A shielding apparatus for use in a printed circuit board shields electronic circuitry mounted on the printed circuit board against interfering electric waves. The shielding apparatus comprises a multi-layer printed circuit board having a circuit trace printed on a middle layer and a ground trace printed on each of the surface layers. Circuitry blocks consisting of a plurality of electrical elements are mounted on the top surface of the printed circuit board and are electrically connected to one another by the circuit trace. Metallic cases are provided on the top and bottom surfaces of the printed circuit board for covering the circuitry blocks and are in contact with the ground trace.

5 Claims, 2 Drawing Sheets

SHIELDING APPARATUS FOR A PRINTED CIRCUIT BOARD

TECHNICAL FIELD

The present invention relates generally to a shielding apparatus for use on a printed circuit board and, more particularly, to an apparatus for shielding circuitry on a printed circuit board against disturbances due to interfering electric waves.

BACKGROUND OF THE INVENTION

It is well known in some types of electrical apparatus, such as radio apparatus, to provide a shielding structure for the printed circuit board, such as shown in FIGS. 1 and 2. FIG. 1 is a cross sectional view of the shielding structure and FIG. 2 is a cross sectional view of the structure taken along line A—A of FIG. 1.

As shown in the figures, printed circuit board 1 comprises a dielectric substrate 11 which serves as a support for the printed wiring, including circuit trace 12 and ground trace 13. Ground trace 13 is that portion of the printed wiring which is adapted to be connected to a source of ground potential and circuit trace 12 is the remainder of the printed wiring on printed circuit board 1 and is usually operated at potentials other than ground potential. Circuit trace 12 is only printed on the bottom surface of dielectric substrate 11 and ground trace 13 is printed on both the top and bottom surfaces of the dielectric substrate. The top surface of printed circuit board 1 is coated with a material that is resistant to solder, except for a part of the land of circuit trace 12 and a part of ground trace 13 which is in contact with metallic cases 2a and 2b. The method of construction of printed circuit board 1 and the materials from which it is made are well known and will not be discussed here.

Circuitry blocks 3 comprise a plurality of electrical elements, such as transistors, amplifiers, etc., and are mounted on the top surface of printed circuit board 1 with the input and output terminals in circuitry blocks 3 being connected to the land of circuit trace 12 with solder via through holes (not shown). Circuitry blocks 3 are also isolated from one another by metallic cases 2a and 2b.

Narrow grooves 2c are formed in a portion of metallic case 2b proximate circuit trace 12 to prevent contact between metallic case 2b and circuit trace 12, as best shown in FIG. 2. The portions of metallic cases 2a and 2b adjacent ground trace 13 are held in contact with ground trace 13 by securing elements, e.g., screws, (not shown). Contacting material 4, formed of an elastic material inserted into a cylindrical wire netting, is inserted into grooves formed in metallic cases 2a and 2b and is sandwiched between cases 2a and 2b and ground trace 13 to ensure firm contact between ground trace 13 and metallic cases 2a and 2b. The effect of this arrangement is that each of circuitry blocks 3 is covered by metallic cases 2a and 2b and is shielded against interfering electric waves, such as high frequency radio waves, from another circuitry block 3.

As explained above, in the prior art shielding apparatus, it is necessary to form narrow grooves 2c in metallic case 2b to prevent contact between metallic case 2b and circuit trace 12. Because electric waves may be transmitted from one circuitry block to another circuitry block via narrow grooves 2c, interference between circuitry blocks may occur, particularly in the case of high frequency radio waves. In addition, the manufacturing process is also complicated because of the need to suitably adjust the length of contacting material 4, to account for narrow grooves 2c, so that contacting material 4 can be positioned within the area between metallic case 2b and ground trace 13. It is also necessary in manufacturing metallic case 2b to accurately position narrow grooves 2c to prevent contact between metallic case 2b and circuit trace 12.

SUMMARY OF THE INVENTION

It is a primary object of the present invention to provide a shielding apparatus for shielding electric circuitry on a printed circuit board against interfering electric waves.

It is another object of the present invention to provide a shielding apparatus which can be easily and inexpensively manufactured.

In accordance with the present invention, there is provided a shielding apparatus for use on a printed circuit board which shields the electric circuitry from disturbances due to interfering waves. The apparatus comprises a multi-layer printed circuit board including a circuit trace and a ground trace. The circuit trace is printed on a middle surface layer of the circuit board and the ground trace is printed on each of the surface layers. Circuitry blocks comprising a plurality of electronic circuit elements are mounted on the top surface of the multi-layer printed circuit board and the input and output terminals in the circuitry blocks are connected to the circuit trace with solder via through holes. Metallic cases are provided for covering the circuitry blocks and portions of each of the metallic cases are in contact with the ground trace, via contacting material, on the top and bottom surfaces of the circuit board. In a preferred embodiment, at least one circuitry block is covered by the metallic cases. The covered circuitry block is electrically connected to a second circuitry block via the circuit trace on the middle layer and the second circuitry block may or may not be covered by the metallic cases. Because it is not necessary to form narrow grooves in the metallic case to prevent contact with the circuit trace, the circuitry block is effectively shielded.

DETAILED DESCRIPTION OF THE PREFERRED EMBODIMENT

Figure 1:
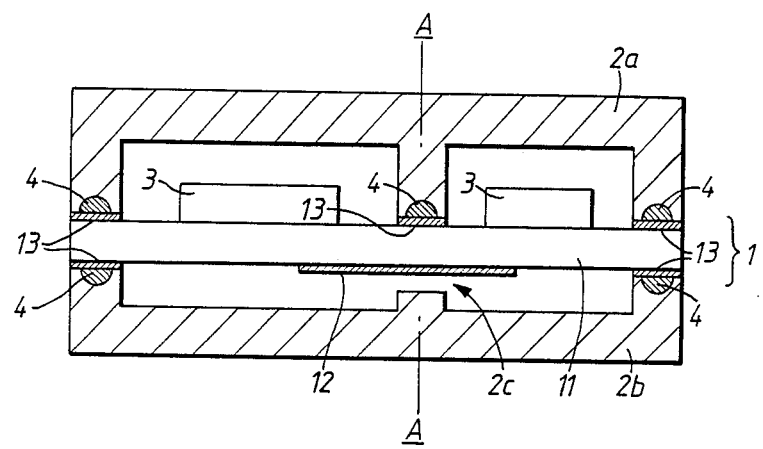
FIG. 1 is a cross-sectional view of a shielding apparatus known in the prior art.
Figure 2:
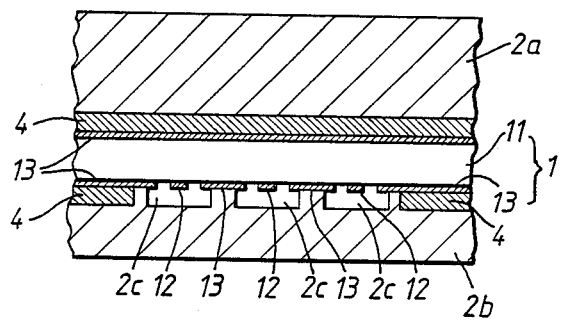
FIG. 2 is a cross-sectional view taken along line A—A of FIG. 1.
Figure 3:
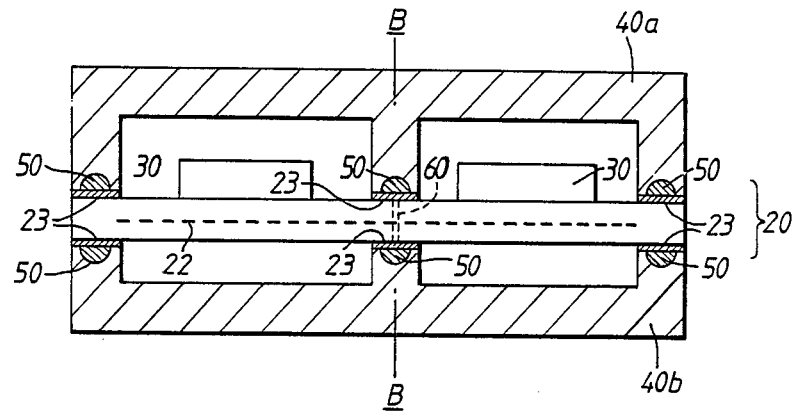
FIG. 3 is a cross-sectional view of a shielding apparatus according to a first embodiment of the present invention.
Figure 4:
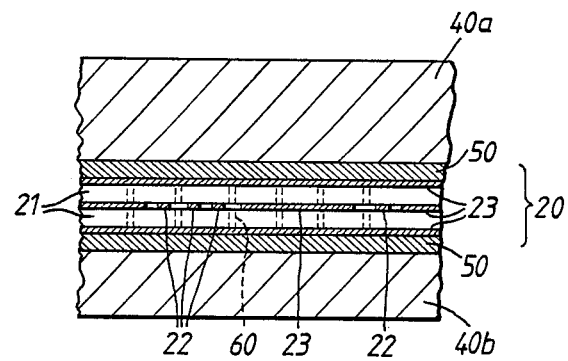
FIG. 4 is a cross-sectional view taken along line B—B of FIG. 3.

With reference to FIG. 3, there is shown a multi-layer printed circuit board 20, including printed circuit trace 22 and ground trace 23. Circuitry blocks 30 comprising a plurality of electronic elements, such as transistors, amplifiers etc., are mounted on the top surface of printed circuit board 20 and metallic cases 40a, 40b are provided on the top and bottom surfaces of the printed circuit board for shielding circuitry blocks 30. As shown in FIG. 4, which is a cross-sectional view taken along line B—B of FIG. 3, multi-layer printed circuit 20 comprises dielectric substrates 21 which serve as supports for the printed wiring, including circuit trace 22 and ground trace 23. Circuit trace 22 is printed on a middle layer of multi-layer printed circuit board 20 and ground trace 23 is printed on the top, middle and bottom layers. Ground trace 23 surrounds each of circuitry blocks 30 so that circuit trace 22 may also be printed on the top or bottom layers within the area of circuitry blocks 30, if desired.

The top surface of multi-layer printed circuit board 20 is coated with a material that is resistant to solder, except for a part of ground trace 23 which is in contact with metallic cases 40a and 40b. A plurality of through holes 60 are formed in ground trace 23 between circuitry blocks 30 to electrically interconnect ground trace 23 on each of the surface layers and thus increase the shielding effect. Through holes 60 are preferably arranged with a separation distance of less than $\lambda/100$, where $\lambda$ represents the wave length of shielding. For example, if $\lambda$ equals 30 cm. and the frequency of shielding is 1,000 MHz, through holes 60 are arranged with a separation distance of under 3 mm. (30 cm/100). This technique is well known to those skilled in the art.

The shielding effect in the present arrangement is also enhanced by the fact that circuit trace 22 is sandwiched between ground traces 23. Thus, the arrangement functions like a coaxial cable, such as that used in high frequency radio apparatus, with the ground trace acting as an outer conductor and the circuit trace becoming an inner conductor.

As described above and best shown in FIG. 3, metallic cases 40a and 40b are provided on the top and bottom surfaces of printed circuit board 20 and are held in contact with ground trace 23 by securing elements, e.g. screws. In addition, contacting material 50 is inserted into grooves in metallic cases 40a and 40b and sandwiched between metallic cases 40a and 40b and ground trace 23 to ensure firm contact between ground trace 13 and metallic cases 40a and 40b. In this way, each of the circuitry blocks 30 is covered by metallic cases 40a and 40b and is shielded against interfering electric wave from another circuitry block 30.

Figure 5:
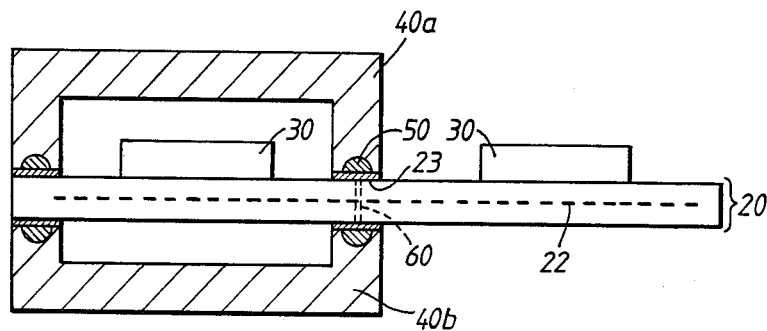
FIG. 5 is a cross-sectional view of a shielding apparatus according to second embodiment of the present invention.

FIG. 5 illustrates a second embodiment of the present invention. In FIG. 5, two circuitry blocks 30 are shown which are electrically connected by circuit trace 22. The shielding structure of FIG. 5 is substantially identical to that of FIGS. 3 and 4 except that only one of circuitry blocks 30 is covered by metallic cases 40a and 40b.

In the above-described embodiments, through holes 60 are formed in the ground trace between adjacent circuitry blocks 30. However, it is understood that through holes 60 may be formed wherever ground trace 23 is in contact with metallic cases 40a and 40b. Further, though in the above-described embodiments, a three-layer printed circuit board is used, multi-layer printed circuit board 20 may have any number of layers.

This invention has been described in detail in connection with the preferred embodiments. These embodiments are examples only and the invention is not restricted thereto. It will be easily understood by those skilled in the art that variations and modifications can be made to the invention within the scope of the appended claims.

I claim:

1. A shielding apparatus for shielding electric circuitry mounted on a printed circuit board against interfering electric waves comprising:
   a multi-layer printed circuit board having a circuit trace printed on a middle layer;
   a first circuitry block mounted on an outer surface of said multi-layer printed circuit board, said first circuitry block being electrically connected to said circuit trace, so that said first circuitry block is connected to at least one other circuitry block mounted on said multi-layer printed circuit board via said circuit trace; and
   metallic plate means covering said first circuitry block to thereby isolate said first circuitry block from said other circuitry block.

2. A shielding apparatus according to claim 1 wherein said multi-layer printed circuit board further includes a ground trace printed on each of the outer surface layers of the circuit board, said ground trace being in contact with said metallic means.

3. A shielding apparatus according to claim 2 further comprising a contacting material sandwiched between and contacting both said ground trace and said metallic means to ensure firm contact between the ground trace and the metallic means.

4. A shielding apparatus according to claim 2 wherein a plurality of through holes are formed in the printed circuit board so so that said ground trace printed on each of the surface layers are connected to each other by said through holes.

5. A shielding apparatus according to claim 1 wherein said first circuitry block is mounted on the top surface layer of said printed circuit board and said metallic means comprises first and second metallic means, said first metallic means covering said first circuitry block and said second metallic means being provided on the bottom surface layer of the printed circuit board at a location corresponding to the location of said first metallic means.

* * * * *